(12) United States Patent
Yu

(10) Patent No.: US 7,352,839 B2
(45) Date of Patent: Apr. 1, 2008

(54) DYNAMIC SHIFT REGISTER CIRCUIT

(75) Inventor: Jian-Shen Yu, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 143 days.

(21) Appl. No.: 11/425,022

(22) Filed: Jun. 19, 2006

(65) Prior Publication Data

US 2007/0177712 A1    Aug. 2, 2007

(30) Foreign Application Priority Data

Jan. 27, 2006   (TW) .............................. 95103760 A

(51) Int. Cl.
*G11C 19/00*   (2006.01)
(52) U.S. Cl. .......................................... 377/64; 377/79
(58) Field of Classification Search .................. 377/64, 377/77, 78, 79
See application file for complete search history.

(56) References Cited

U.S. PATENT DOCUMENTS

| 4,538,288 | A | | 8/1985 | Soneda et al. |
| 5,949,398 | A | * | 9/1999 | Kim ........................... 345/100 |
| 6,778,627 | B2 | | 8/2004 | Yu |
| 6,834,095 | B2 | | 12/2004 | Yu |
| 6,885,723 | B2 | | 4/2005 | Yu |
| 6,928,135 | B2 | | 8/2005 | Sasaki et al. |
| 7,289,593 | B2 | * | 10/2007 | Tobita et al. .................. 377/64 |
| 2002/0167026 | A1 | | 11/2002 | Azami et al. |

* cited by examiner

*Primary Examiner*—Kenneth B. Wells
(74) *Attorney, Agent, or Firm*—Grossman Tucker Perreault & Pfleger PLLC

(57) ABSTRACT

An improved dynamic shift register circuit is disclosed. A circuit design is provided to minimize overlapping between two adjacent output pulses in the dynamic shift register circuit. In an application of analog sample-and-hold circuit, the circuit design effectively improves a distortion of sampled data caused by significant overlapping of two adjacent output pulses as control signals.

17 Claims, 10 Drawing Sheets

DYNAMIC SHIFT REGISTER CIRCUIT

This application benefits from the priority based on Taiwan Patent Application No. 095103760 filed on Jan. 27, 2006.

CROSS-REFERENCES TO RELATED APPLICATIONS

Not applicable.

BACKGROUND OF THE INVENTION

1. Field of the Invention

The present invention relates to a dynamic shift register circuit, and more specifically, to a dynamic shift register circuit for minimizing overlapping between two adjacent output pulses.

2. Descriptions of the Related Art

Recently, Thin-Film Transistor Liquid Crystal Display (TFT-LCD) has been widely utilized in personal computer display, TV, cell phones, and digital camera. Process technique nowadays can arrange the pixel arrays and the driving circuits of the liquid crystal display on a substrate for the aim of minimizing the cost and the weights thereof. The pixel arrays comprise a plurality of scanning lines and a plurality of signal lines while the driving circuits comprise a plurality of shift register circuits, electrically connected with each other, to output a plurality of horizontal and vertical scanning clock signals for driving each of the scanning lines and the signal lines respectively. Thus, display images inputted to the liquid crystal display are transmitted in turn to the related pixel arrays. If an overlapping phenomenon is occurred between two adjacent clock signals of the horizontal scanning and/or the vertical scanning clock signals, some pixels fail to correctly receive the image data or receive the image data which does not belong to them during receiving the image data. Therefore, part of image data will be incorrectly displayed on pixels which are not corresponding to that the display shown is not stable and the display quality is affected.

FIG. 1A illustrates a circuit diagram of a prior dynamic shift register circuit in U.S. Pat. No. 6,834,095. A complete shift register circuit can be made by electrically connecting a plurality of circuits shown in FIG. 1A in series. In FIG. 1A, CK represents a clock input signal, XCK represents an inverse clock input signal, (N−1)out represents an output end of a previous-stage shift register unit, (N)out represents an output end of the present stage shift register unit, (N+1)out represents an output end of a next-stage shift register. These output signals are used to drive the scanning lines and the signal lines of the pixel arrays. Please refer to FIG. 1B and FIG. 1C. FIG. 1B illustrates a voltage-to-time oscillograph of each stage of a prior dynamic shift register circuit shown in FIG. 1A and FIG. 1C illustrates an enlarged overlap-pulse oscillograph of the two stages while the simulation conditions of the above-mentioned waveform is: 50% duty cycle of the clock signal and the inverse clock signal, 2 volts of the threshold voltage of the transistor, and 10 pF of the load of the output end. From FIG. 1B, the overlapping phenomenon of these two signals of adjacent output ends is obvious. From FIG. 1C, the voltage of the cross point of the two overlapping output signals is about 10.7 volts.

To sum up, the signals of two adjacent output ends in the prior dynamic shift register circuit have a serious problem about an overlapping phenomenon. The voltage of the cross point thereof is also essentially high. Consequently, the possibility that the pixel arrays receive wrong image data is quite high. Moreover, the failure of sampling data will lead to serious distortion of display images. Only those problems are effectively solved the display quality of liquid crystal display or the like can be enhanced.

SUMMARY OF THE INVENTION

The primary objective of this invention is to provide a dynamic shift register circuit for reducing the voltage of the cross point of two adjacent output pulses effectively and also avoiding an error of data inputting. The dynamic shift register circuit comprises a plurality of shift register units connected in series. The shift register units are controlled by a first clock signal and a second clock signal. Each of the shift register units comprises an input transistor assembly, a first output transistor, a second output transistor, a switch transistor, and a switch. The input transistor assembly has a first electrode, a second electrode, and a gate electrode. The first output transistor has a first electrode, a second electrode, and a gate electrode. The second output transistor has a first electrode, a second electrode, and a gate electrode. The switch transistor has a first electrode, a second electrode, and a gate electrode. The gate electrode of the input transistor assembly is adapted to receive the inverse clock signal. The first electrode of the input transistor assembly is adapted to receive an output signal of the previous-stage shift register unit. The first electrode of the first output transistor is adapted to receive the clock signal. The gate electrode of the first output transistor is coupled with the second electrode of the input transistor assembly. The second electrode of the first output transistor is coupled with the switch. The first electrode of the switch transistor is coupled with the gate electrode of the first output transistor. The second electrode of the switch transistor is coupled with the gate electrode of the second output transistor. The gate electrode of the switch transistor is adapted to receive the inverse signal of the output signal of the previous-stage shift register unit. The first electrode of the second output transistor is adapted to receive the clock signal, and the second electrode of the second output transistor is coupled with an output end of the shift register unit.

Another objective of this invention is to provide a dynamic shift register circuit for reducing the voltage of the cross point of two adjacent output pulses effectively and also avoiding an error of data inputting. The dynamic shift register circuit comprises a plurality of shift register units connected in series. The shift register units are controlled by a first clock signal and a second clock signal. Each of the shift register units comprises an input transistor assembly, a first output transistor, a second output transistor, a switch transistor, and a switch. The input transistor assembly has a first electrode, a second electrode, and a gate electrode. The first output transistor has a first electrode, a second electrode, and a gate electrode. The second output transistor has a first electrode, a second electrode, and a gate electrode. The switch transistor has a first electrode, a second electrode, and a gate electrode. The gate electrode of the input transistor assembly is coupled with the first electrode of the input transistor assembly. The first electrode of the input transistor assembly is adapted to receive an output signal of the previous-stage shift register unit. The first electrode of the first output transistor is adapted to receive the clock signal. The gate electrode of the first output transistor is coupled with the second electrode of the input transistor assembly. The second electrode of the first output transistor is coupled with the switch. The first electrode of the switch transistor is coupled with the gate electrode of the first output transistor. The second electrode of the switch transistor is coupled with the gate electrode of the second output transistor. The gate electrode of the switch transistor is adapted to receive an inverse signal of the output signal of the previous-stage shift register unit. The first electrode of the second output transistor is adapted to receive the clock signal, and the second electrode of the second output transistor is coupled with an output end of the shift register unit.

The dynamic shift register circuit of the present invention can minimize the voltage of the cross point of two adjacent output pulses effectively, and let the pixel arrays will not receive wrong data under the control of the dynamic shift register circuit of the present invention. The display quality and the stability of products can be effectively evaluated.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1A:
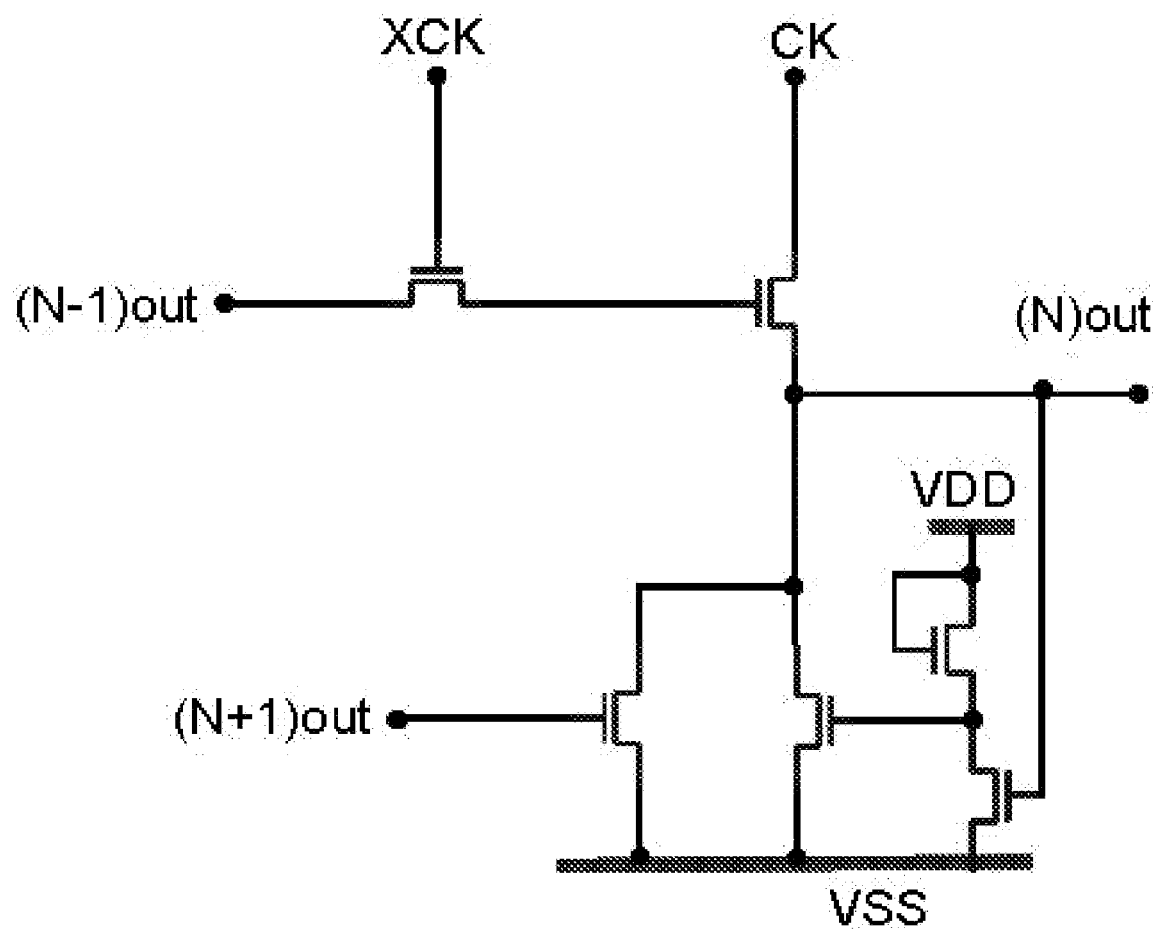
FIG. 1A illustrates a circuit diagram of a dynamic shift register circuit of the prior art.
Figure 1B:
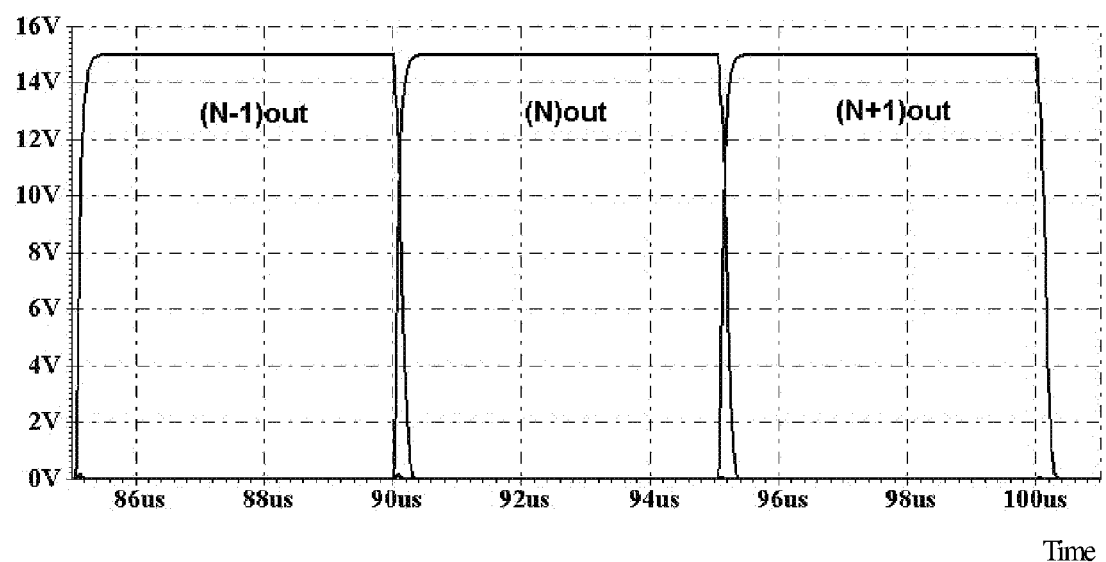
FIG. 1B illustrates a voltage-to-time oscillograph of output ends of each stage of a dynamic shift register circuit of the prior art.
Figure 1C:
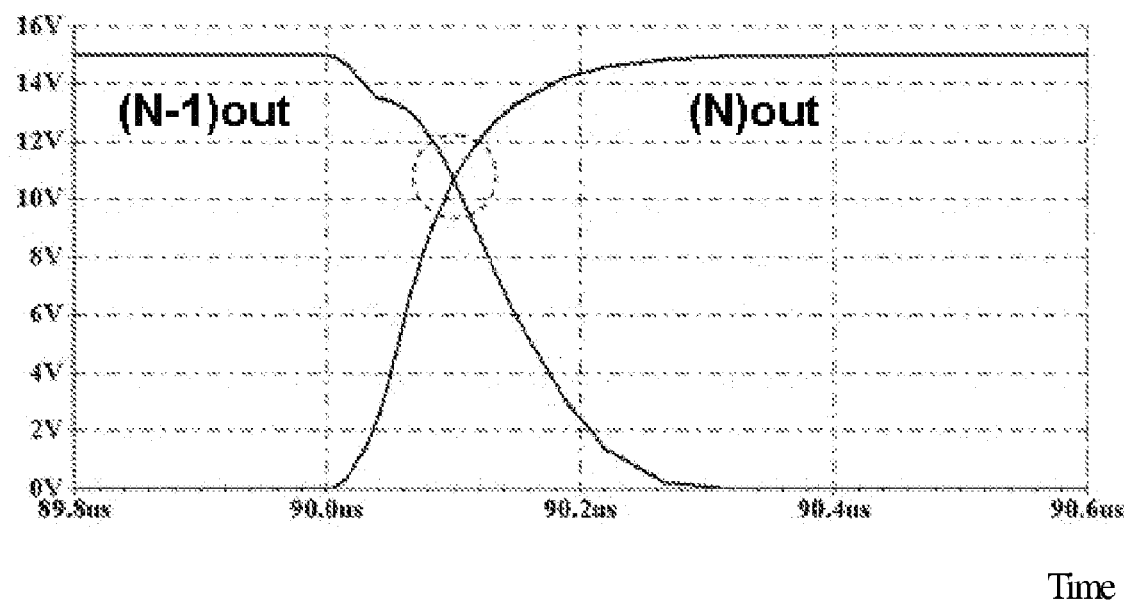
FIG. 1C illustrates an enlarged voltage-to-time oscillograph of overlapping pulses of output ends of each stage of a dynamic shift register circuit of the prior art.
Figure 2A:
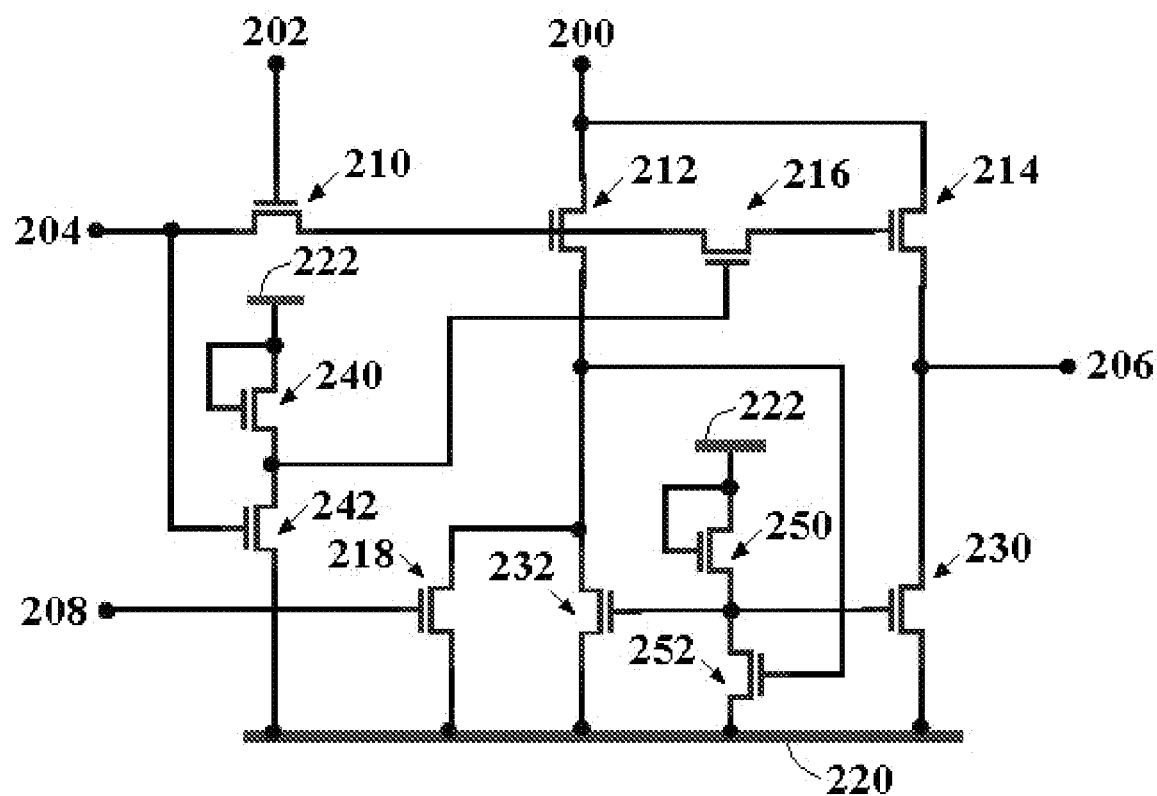
FIG. 2A illustrates a circuit diagram of a preferred embodiment of a dynamic shift register circuit of the present invention.

FIG. 2A shows a circuit diagram of a dynamic shift register circuit of a preferred embodiment of the present invention. The dynamic shift register circuit comprises a plurality of shift register units connected in series. The shift register units are controlled by a clock signal 200 and an inverse clock signal 202. Each of the shift register units comprises an input transistor assembly 210, a first output transistor 212, a second output transistor 214, a switch transistor 216, a fourth transistor 230, a fifth transistor 232, a sixth transistor 240, a seventh transistor 242, a eighth transistor 250, and a ninth transistor 252. The input transistor assembly 210 as shown in FIG. 2A of this embodiment is an input transistor and comprises a first electrode, a second electrode, and a gate electrode. The first output transistor 212 comprises a first electrode, a second electrode, and a gate electrode. The second output transistor 214 comprises a first electrode, a second electrode, and a gate electrode. The switch transistor 216 has a first electrode, a second electrode, and a gate electrode. The switch is a third transistor 218 which comprises a first electrode, a second electrode, and a gate electrode. The fourth transistor 230 comprises a first electrode, a second electrode, and a gate electrode. The fifth transistor 232 comprises a first electrode, a second electrode, and a gate electrode. The sixth transistor 240 comprises a first electrode, a second electrode, and a gate electrode. The seventh transistor 242 comprises a first electrode, a second electrode, and a gate electrode. The eighth transistor 250 comprises a first electrode, a second electrode, and a gate electrode. The ninth transistor 252 comprises a first electrode, a second electrode, and a gate electrode.

A detailed connection manner is described as below. The gate electrode of the third transistor 218 receives an output signal 208 of the next-stage shift register unit, the first electrode of the third transistor 218 is coupled with the second electrode of the first output transistor 212, and the second electrode of the third transistor 218 is coupled with a first power source 220. The gate electrode of the input transistor assembly 210 receives the inverse clock signal 202, and the first electrode of the input transistor assembly 210 receives an output signal 204 of the previous-stage shift register unit. The first electrode of the first output transistor 212 receives the clock signal 200, and the gate electrode of the first output transistor 212 is coupled with the second electrode of the input transistor assembly 210. The first electrode of the switch transistor 216 is coupled with the gate electrode of the first output transistor 212, the second electrode of the switch transistor 216 is coupled with the gate electrode of the second output transistor 214, and the gate electrode of the switch transistor 216 receives the inverse signal of the output signal 204 of the previous-stage shift register unit. The first electrode of the second output transistor 214 receives the clock signal 200, and the second electrode of the second output transistor 214 is coupled with an output end 206 of the shift register units.

The first electrode of the fourth transistor 230 is coupled with the output end 206, and the second electrode of the fourth transistor 230 is coupled with the first power source 220. The first electrode of the fifth transistor 232 is coupled with the second electrode of the first output transistor 212, the second electrode of the fifth transistor 232 is coupled with the first power source 220, and the gate electrode of the fifth transistor 232 is coupled with the gate electrode of the fourth transistor 230. The gate electrode and the first electrode of the sixth transistor 240 are coupled with a second power source 222, and the second electrode of the sixth transistor 240 is coupled with the gate electrode of the switch transistor 216. The gate electrode of the seventh transistor 242 is coupled with the output signal 204 of the previous-stage shift register unit.

The first electrode of the seventh transistor 242 is coupled with the second electrode of the sixth transistor 240, and the second electrode of the seventh transistor 242 is coupled with the first power source 220. The signal level of the second power source 222 is greater than the signal level of the first power source 220. The gate electrode and the first electrode of the eighth transistor 250 are coupled with a second power source 222, and the second electrode of the eighth transistor 250 is coupled with the gate electrode of the fifth transistor 232. The gate electrode of the ninth transistor 252 is coupled with the second electrode of the first output transistor 212, the first electrode of the ninth transistor 252 is coupled with the gate electrode of the fifth transistor 232, and the second electrode of the ninth transistor 252 is coupled with the first power source 220.

Figure 2B:
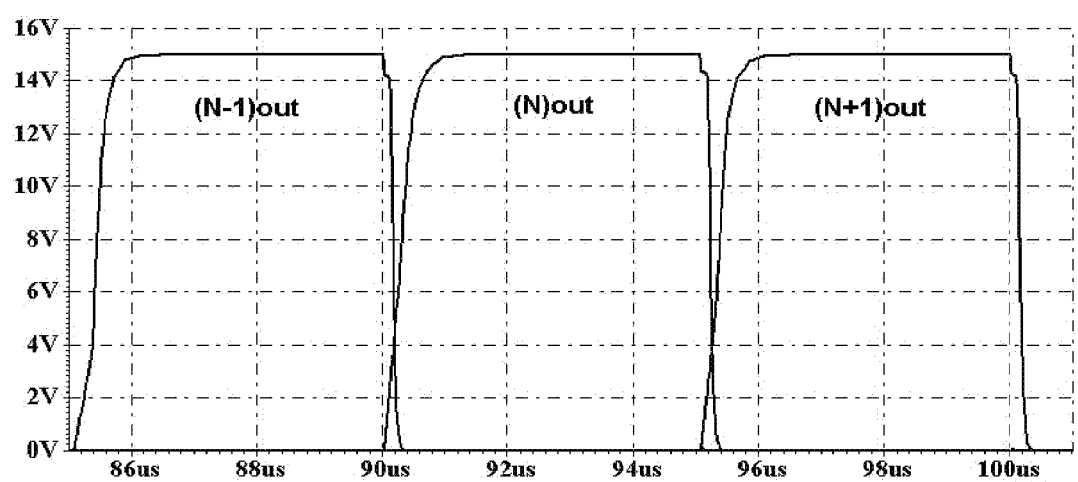
FIG. 2B illustrates a voltage-to-time oscillograph of each stage of FIG. 2A.
Figure 2C:
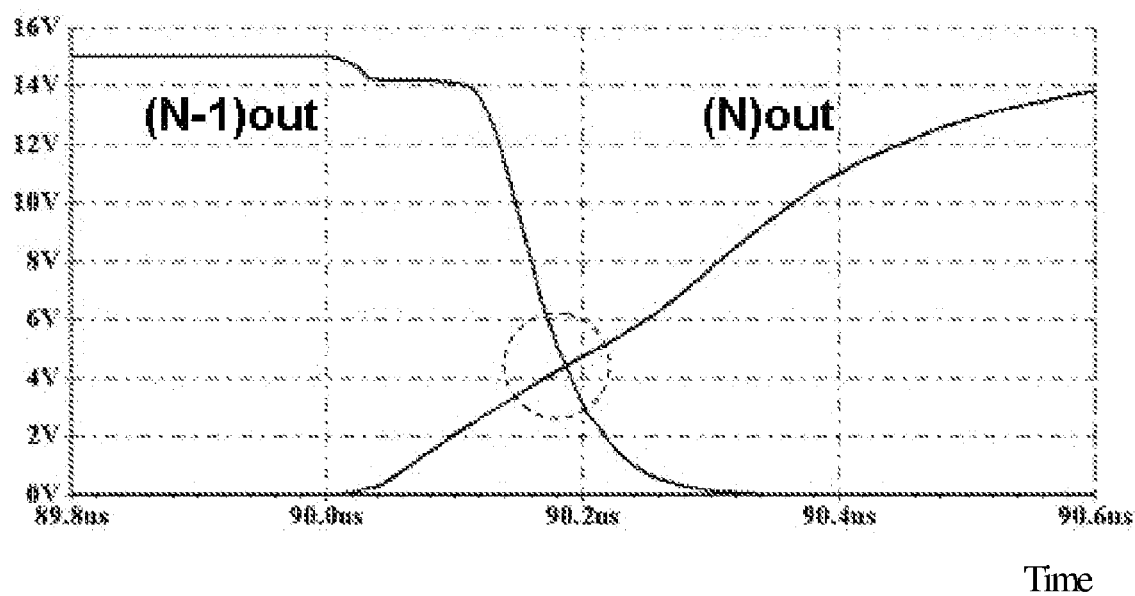
FIG. 2C illustrates an enlarged voltage-to-time oscillograph of overlapping pulses of output ends of each stage of a dynamic shift register circuit of FIG. 2A.

Please refer to FIG. 2B and FIG. 2C simultaneously, which are simulation results of the present invention. FIG. 2B illustrates a voltage-to-time oscillograph of output end of each stage of a dynamic shift register, and FIG. 2C illustrates an enlarged oscillograph of overlapping pulses. The simulation conditions of the above-mentioned waveform are: 50% duty cycle of the clock signal and the inverse clock signal, 2 volts of the threshold voltage of the transistor, and 10 pF of the load of the output end. As shown in FIG. 2B, an overlapping phenomenon of signals of output ends of two adjacent stages is minimized obviously. As shown in FIG. 2C, the voltage of the cross point of the two overlapping signals of the adjacent output ends is about 4.4 volts. Compared with 10.7 volts as illustrated of the prior art, the present invention has substantially improved the disadvantage of the prior art.

Figure 3A:
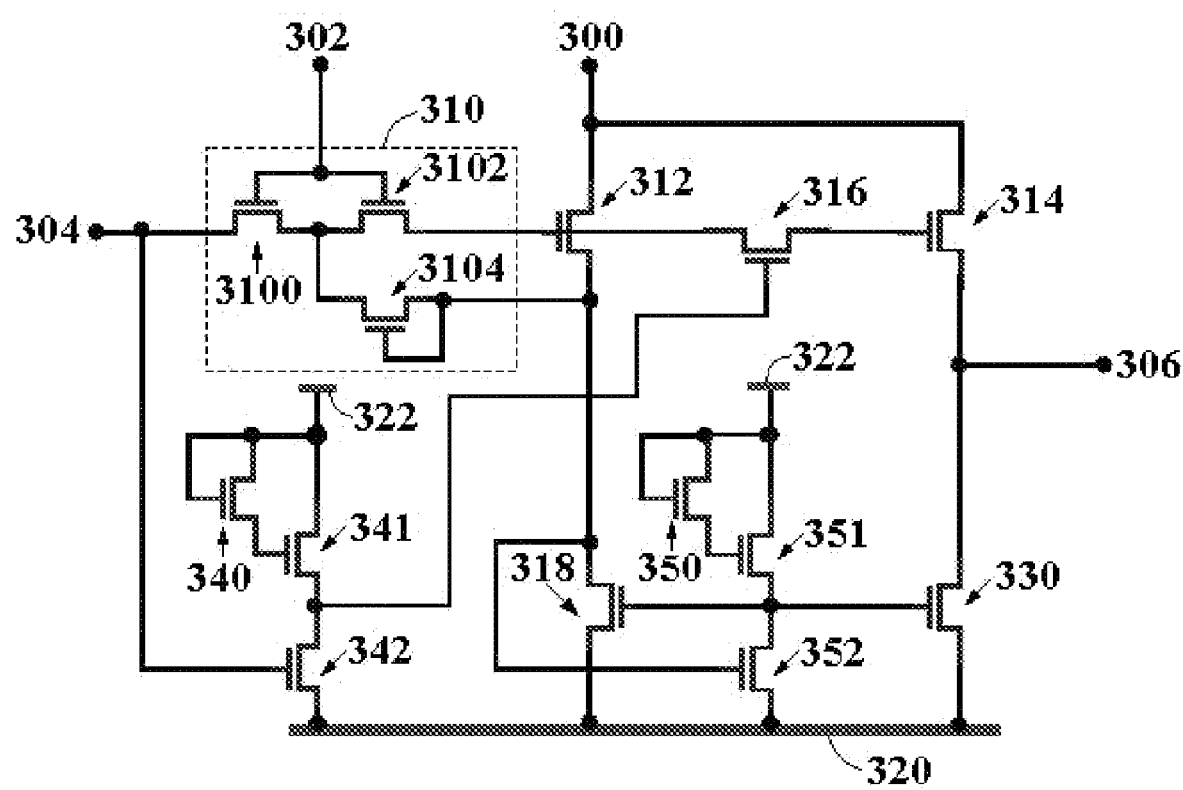
FIG. 3A a circuit diagram of another preferred embodiment of a dynamic shift register circuit of the present invention.

FIG. 3A illustrates a circuit diagram of a dynamic shift register circuit of another preferred embodiment, compared with FIG. 2A of the present invention. FIG. 3A shows an advanced minimization of the voltage of the cross point of the two overlapping signals of the adjacent output ends. The dynamic shift register circuit comprises a plurality of shift register units connected in series. The shift register units are controlled by a clock signal 300 and an inverse clock signal 302. Each of the shift register units comprises an input transistor assembly 310, a first output transistor 312, a second output transistor 314, a switch transistor 316, a switch, a fourth transistor 330, a fifth transistor 340, a sixth transistor 341, a seventh transistor 342, an eighth transistor 350, a ninth transistor 351, and a tenth transistor 352.

The input transistor assembly 310 comprises a first electrode, a second electrode, and a gate electrode. The first output transistor 312 comprises a first electrode, a second electrode, and a gate electrode. The second output transistor 314 comprises a first electrode, a second electrode, and a gate electrode. The switch is a third transistor 318 comprises a first electrode, a second electrode, and a gate electrode. The fourth transistor 330 comprises a first electrode, a second electrode, and a gate electrode. The fifth transistor 340 comprises a first electrode, a second electrode, and a gate electrode. The sixth transistor 341 comprises a first electrode, a second electrode, and a gate electrode. The seventh transistor 342 comprises a first electrode, a second electrode, and a gate electrode. The eighth transistor 350 comprises a first electrode, a second electrode, and a gate electrode. The ninth transistor 351 comprises a first electrode, a second electrode, and a gate electrode. The tenth transistor 352 comprises a first electrode, a second electrode, and a gate electrode. The input transistor assembly 310 comprises a first input transistor 3100, a second input transistor 3102, and a third input transistor 3104. The first input transistor 3100 comprises a first electrode, a second electrode, and a gate electrode. The second input transistor 3102 comprises a first electrode, a second electrode, and a gate electrode. The third input transistor 3104 comprises a first electrode, a second electrode, and a gate electrode.

A detailed connection manner is described as below. The gate electrode of the input transistor assembly 310 receives the inverse clock signal 302, the first electrode of the input transistor assembly 310 receives an output signal 304 of the previous-stage shift register unit. The gate electrode of the first input transistor 3100 receives the inverse clock signal 320. The first electrode of the first input transistor 3100 is coupled with the first electrode of the input transistor assembly 310. The gate electrode of the second input transistor 3102 receives the inverse clock signal 320, the first electrode of the second input transistor 3102 is coupled with the second electrode of the first input transistor 3100, and the second electrode of the second input transistor 3102 is coupled with the second electrode of the input transistor assembly 310. The gate electrode and the first electrode of the third input transistor 3104 are coupled with the second electrode of the first output transistor 312.

The second electrode the third input transistor 3104 is coupled with the second electrode of the first input transistor 3100. The first electrode of the first output transistor 312 receives the clock signal 300. The gate electrode of the first output transistor 312 is coupled with the second electrode of the input transistor assembly 310. The second electrode of the first output transistor 312 is coupled with the switch. The first electrode of the switch transistor 316 is coupled with the gate electrode of the first output transistor 312. The second electrode of the switch transistor 316 is coupled with the gate electrode of the second output transistor 314. The gate electrode of the switch transistor 316 receives an inverse signal of the output signal of the previous-stage shift register unit. The first electrode of the second output transistor 314 receives the clock signal 300, and the second electrode of the second output transistor 314 is coupled with an output end 306 of the shift register unit. The first electrode of the third transistor 318 is coupled with the second electrode of the first output transistor 312, and the second electrode of the third transistor 318 is coupled with a first power source 320.

The gate electrode of the fourth transistor 330 is coupled with the gate electrode of the third transistor 318. The first electrode of the fourth transistor 330 is coupled with the output end 306, and the second electrode of the fourth transistor 330 is coupled with the first power source 320. The gate electrode and the first electrode of the fifth transistor 340 are coupled with a second power source 322. The gate electrode of the sixth transistor 341 is coupled with the second electrode of the fifth transistor 340. The first electrode of the sixth transistor 341 is coupled with the second power source 322. The second electrode of the sixth transistor 341 is coupled with the gate electrode of the switch transistor 316. The gate electrode of the seventh transistor 342 receives an output signal from the previous-stage shift register unit. The first electrode of the seventh transistor 342 is coupled with the second electrode of the sixth transistor 341. The second electrode of the seventh transistor 342 is coupled with the first power source 320. The signal level of the second power source 322 is greater that of the first power source 320. The gate electrode and the first electrode of the eighth transistor 350 are coupled with the second power source 322. The gate electrode of the ninth transistor 351 is coupled with the second electrode of the eighth transistor 350. The first electrode of the ninth transistor 351 is coupled with the second power source 322. The second electrode of the ninth transistor 351 is coupled with the gate electrode of the third transistor 318. The gate electrode of the tenth transistor 352 is coupled with the second electrode of the first output transistor 312. The first electrode of the tenth transistor 352 is coupled with the gate electrode of the third transistor 318. The second electrode of the tenth transistor 352 is coupled with the first power source 320.

Please refer to FIG. 2A and FIG. 3A simultaneously. In addition to improve the design of the input transistor assembly, the general inverter composed of the sixth transistor 240 and the seventh transistor 242 in FIG. 2A is also replaced by the bootstrap inverter circuit composed of the fifth transistor 340, the sixth transistor 341, and the seventh transistor 342 in FIG. 3A. Similarly, the general inverter composed of the eighth transistor 250 and the ninth transistor 252 in FIG. 2A is also replaced by the bootstrap inverter circuit composed of the eighth transistor 350, the ninth transistor 351, and the tenth transistor 352 in FIG. 3A. By applying such design, the transformation speed of the dynamic shift register circuit can be further increased.

Figure 3B:
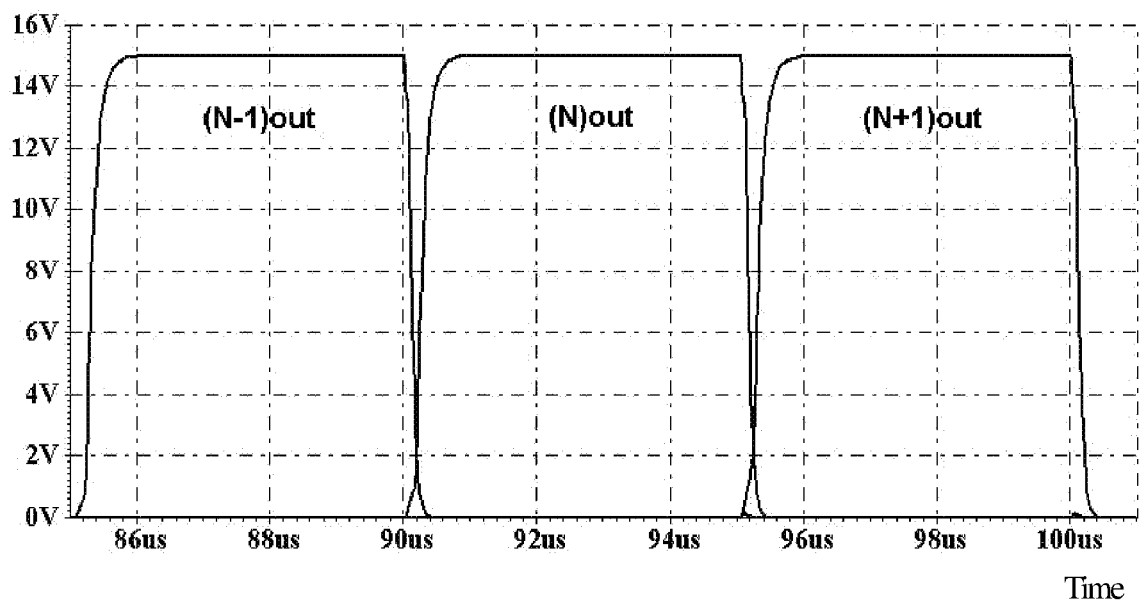
FIG. 3B illustrates a voltage-to-time oscillograph of output ends of each stage of FIG. 3A.
Figure 3C:
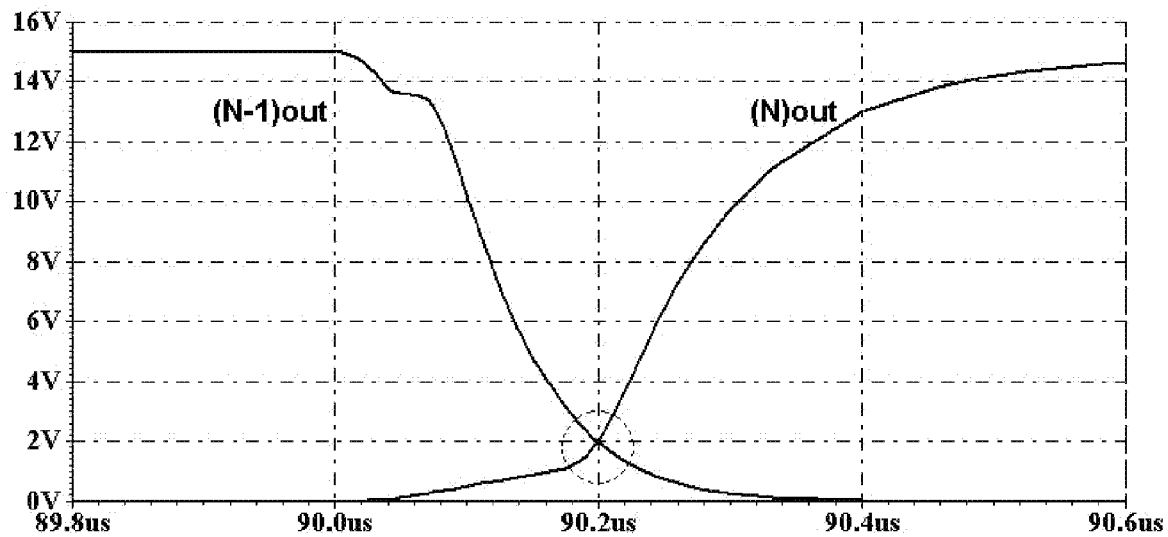
FIG. 3C illustrates an enlarged voltage-to-time oscillograph of overlapping pulses of output ends of each stage of a dynamic shift register circuit of FIG. 3A.

Please refer to FIG. 3B and FIG. 3C simultaneously, which are simulation results of the present invention. FIG. 3B illustrates a voltage-to-time oscillograph of output end of each stage of a dynamic shift register, and FIG. 3C illustrates an enlarged oscillograph of overlapping pulses. The simulation conditions of the above-mentioned waveform are: 50% duty cycle of the clock signal and the inverse clock signal, 2 volts of the threshold voltage of the transistor, and 10 pF of the load of the output end. As shown in FIG. 3B, an overlapping phenomenon of signals of output ends of two adjacent stages is further minimized obviously. As shown in FIG. 3C, the voltage of the cross point of the two overlapping signals of the adjacent output ends is about 2 volts. Compared with 10.7 volts as illustrated of the prior art and 4.4 volts as illustrated FIG. 2A, the effect of reducing the voltage thereof has further improved. In such low voltage of the cross point, the pixel arrays will not receive the wrong data while they are controlled by the dynamic shift register circuit of the present invention. Consequently, the display quality and the stability of products can be sufficiently evaluated.

Figure 4:
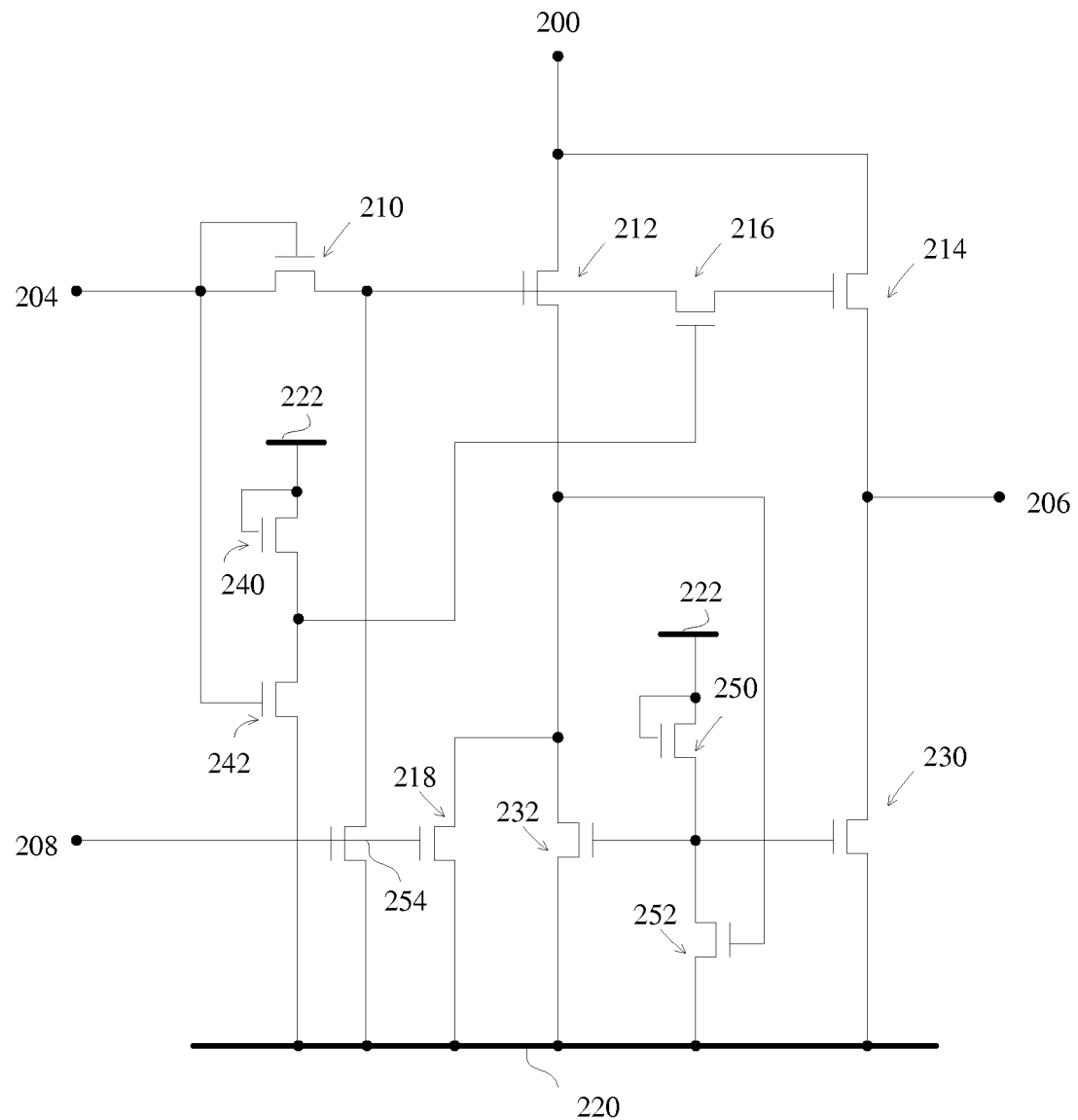
FIG. 4 illustrates a circuit diagram of yet another preferred embodiment of a dynamic shift register circuit of the present invention.

People skilled in this art may proceed with a variety of modifications and replacements based on the disclosures and suggestions of the invention as described without departing from the characteristics thereof. For example, as shown in FIG. 4, it is another embodiment compared with the above-mentioned in FIG. 2A. The difference between them is the first output transistor 212 and the second output transistor 214 is controlled by the clock signal 200 in this embodiment of FIG. 4, while the inverse clock signal which controls the gate of the first input transistor as disclosed of the above-mentioned is replaced by the output signal 204 of the previous-stage shift register unit. In other words, the gate of the first transistor 210 is coupled with its first electrode to receive the output signal 204 of the previous-stage shift register unit. Furthermore, a tenth transistor 254 is used to cross between the second electrode of the first transistor 210 and the first power source 220. More specifically, the first electrode of the tenth transistor 254 is coupled with the second electrode of the first transistor 210, the second electrode of the tenth transistor 254 is coupled with the first power source 220, and the gate of the tenth transistor 254 is controlled by the output signal 208 of the next-stage shift register unit. Consequently, the dynamic shift register circuit of this embodiment can also effectively reduce the voltage of the cross point of the two overlapping signals of the adjacent output ends to avoid an error of inputting data.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A dynamic shift register circuit, comprising a plurality of shift register units connected in series, the shift register units being controlled by a first clock signal and a second clock signal, each of the shift register units comprising:
    an input transistor assembly having a first electrode, a second electrode, and a gate electrode;
    a first output transistor having a first electrode, a second electrode, and a gate electrode;
    a second output transistor having a first electrode, a second electrode, and a gate electrode;
    a switch transistor having a first electrode, a second electrode, and a gate electrode; and
    a switch;
    wherein the gate electrode of the input transistor assembly is adapted to receive the second clock signal, the first electrode of the input transistor assembly is adapted to receive an output signal of the previous-stage shift register unit, the first electrode of the first output transistor is adapted to receive the first clock signal, the gate electrode of the first output transistor is coupled with the second electrode of the input transistor assembly, the second electrode of the first output transistor is coupled with the switch, the first electrode of the switch transistor is coupled with the gate electrode of the first output transistor, the second electrode of the switch transistor is coupled with the gate electrode of the second output transistor, the gate electrode of the switch transistor is adapted to receive the inverse signal of the output signal of the previous-stage shift register unit, the first electrode of the second output transistor is adapted to receive the first clock signal, and the second electrode of the second output transistor is coupled with an output end of the shift register units.

2. The dynamic shift register circuit of claim 1, further comprising a first power source, wherein the switch is a third transistor having a first electrode, a second electrode, and a gate electrode, and the gate electrode of the third transistor is adapted to receive an output signal of the next-stage shift register unit, the first electrode of the third transistor is coupled with the second electrode of the first output transistor, and the second electrode of the third transistor is coupled with the first power source.

3. The dynamic shift register circuit of claim 2, wherein the shift register unit further comprises:
    a fourth transistor having a first electrode, a second electrode, and a gate electrode; and
    a fifth transistor having a first electrode, a second electrode, and a gate electrode;
    wherein the first electrode of the fourth transistor is coupled with the output end, the second electrode of the fourth transistor is coupled with the first power source, the first electrode of the fifth transistor is coupled with the second electrode of the first output transistor, the second electrode of the fifth transistor is coupled with the first power source, and the gate electrode of the fifth transistor is coupled with the gate electrode of the fourth transistor.

4. The dynamic shift register circuit of claim 3, further comprising a second power source, wherein the shift register unit further comprises:
    a sixth transistor having a first electrode, a second electrode, and a gate electrode; and
    a seventh transistor having a first electrode, a second electrode, and a gate electrode;
    wherein the gate electrode and the first electrode of the sixth transistor are coupled with the second power source, the second electrode of the sixth transistor is coupled with the gate electrode of the switch transistor, the gate electrode of the seventh transistor is coupled with the output signal of the previous-stage shift register unit, the first electrode of the seventh transistor is coupled with the second electrode of the sixth transistor, the second electrode of the seventh transistor is coupled with the first power source, and the signal level of the second power source is greater than the signal level of the first power source.

5. The dynamic shift register circuit of claim 3, further comprising a second power source, wherein the shift register unit further comprises:
an eighth transistor having a first electrode, a second electrode, and a gate electrode; and
a ninth transistor having a first electrode, a second electrode, and a gate electrode;
wherein the gate electrode and the first electrode of the eighth transistor is coupled with the second power source, the second electrode of the eighth transistor is coupled with the gate electrode of the fifth transistor, the gate electrode of the ninth transistor is coupled with the second electrode of the first output transistor, the first electrode of the ninth transistor is coupled with the gate electrode of the fifth transistor, and the second electrode of the ninth transistor is coupled with the first power source.

6. The dynamic shift register circuit of claim 1, further comprising a first power source, wherein the switch is a third transistor having a first electrode, a second electrode, and a gate electrode, the shift register unit further comprises a fourth transistor having a first electrode, a second electrode, and a gate electrode, the first electrode of the third transistor is coupled with the second electrode of the first output transistor, the second electrode of the third transistor is coupled with the first power source, the gate electrode of the fourth transistor is coupled with the gate electrode of the third transistor, the first electrode of the fourth transistor is coupled with the output end, and the second electrode of the fourth transistor is coupled with the first power source.

7. The dynamic shift register circuit of claim 6, further comprising a second power source, wherein the shift register unit further comprises:
a fifth transistor having a first electrode, a second electrode, and a gate electrode;
a sixth transistor having a first electrode, a second electrode, and a gate electrode; and
a seventh transistor having a first electrode, a second electrode, and a gate electrode;
wherein the gate electrode and the first electrode of the fifth transistor are coupled with the second power source, the gate electrode of the sixth transistor is coupled with the second electrode of the fifth transistor, the first electrode of the sixth transistor is coupled with the second power source, the second electrode of the sixth transistor is coupled with the gate electrode of the switch transistor, the gate electrode of the seventh transistor is adapted to receive an output signal from the previous-stage shift register unit, the first electrode of the seventh transistor is coupled with the second electrode of the sixth transistor, the second electrode of the seventh transistor is coupled with the first power source, and the signal level of the second power source is greater than the signal level of the first power source.

8. The dynamic shift register circuit of claim 6, further comprising a second power source, wherein the shift register unit further comprises:

an eighth transistor having a first electrode, a second electrode, and a gate electrode;
a ninth transistor having a first electrode, a second electrode, and a gate electrode; and
a tenth transistor having a first electrode, a second electrode, and a gate electrode;
wherein the gate electrode and the first electrode of the eighth transistor are coupled with the second power source, the gate electrode of the ninth transistor is coupled with the second electrode of the eighth transistor, the first electrode of the ninth transistor is coupled with the second power source, the second electrode of the ninth transistor is coupled with the gate electrode of the third transistor, the gate electrode of the tenth transistor is coupled with the second electrode of the first output transistor, the first electrode of the tenth transistor is coupled with the gate electrode of the third transistor, the second electrode of the tenth transistor is coupled with the first power source, and the signal level of the second power source is greater than the signal level of the first power source.

9. The dynamic shift register circuit of claim 1, wherein the input transistor assembly only has an input transistor.

10. The dynamic shift register circuit of claim 1, wherein the input transistor assembly further comprises:
a first input transistor having a first electrode, a second electrode, and a gate electrode; and
a second input transistor having a first electrode, a second electrode, and a gate electrode;
wherein the gate electrode of the first input transistor is adapted to receive the second clock signal, the first electrode of the first input transistor is coupled with the first electrode of the input transistor assembly, the gate electrode of the second input transistor is adapted to receive the second clock signal, the first electrode of the second input transistor is coupled with the second electrode of the first input transistor, and the second electrode of the second input transistor is coupled with the second electrode of the input transistor assembly.

11. The dynamic shift register circuit of claim 10, wherein the input transistor assembly further comprises a third input transistor having a first electrode, a second electrode, and a gate electrode, the gate electrode and the first electrode of the third input transistor are coupled with the second electrode of the first output transistor, and the second electrode of the third input transistor is coupled with the second electrode of the first input transistor.

12. A dynamic shift register circuit, comprising a plurality of shift register units connected in series, the shift register units being controlled by a clock signal, each of the shift register units comprising:
an input transistor assembly having a first electrode, a second electrode, and a gate electrode;
a first output transistor having a first electrode, a second electrode, and a gate electrode;
a second output transistor having a first electrode, a second electrode, and a gate electrode;
a switch transistor having a first electrode, a second electrode, and a gate electrode; and
a switch;
wherein the gate electrode of the input transistor assembly is coupled with the first electrode of the input transistor assembly, the first electrode of the input transistor assembly is adapted to receive an output signal of the previous-stage shift register unit, the first electrode of the first output transistor is adapted to receive the clock signal, the gate electrode of the first output transistor is coupled with the second electrode of the input transistor assembly, the second electrode of the first output transistor is coupled with the switch, the first electrode of the switch transistor is coupled with the gate electrode of the first output transistor, the second electrode of the switch transistor is coupled with the gate electrode of the second output transistor, the gate electrode of the switch transistor is adapted to receive an inverse signal of the output signal of the previous-stage shift register unit, the first electrode of the second output transistor is adapted to receive the clock signal, and the second electrode of the second output transistor is coupled with an output end of the shift register unit.

13. The dynamic shift register circuit of claim 12, further comprising a first power source, wherein the switch comprises a third transistor having a first electrode, a second electrode, and a gate electrode, the gate electrode of the third transistor is adapted to receive an output signal of the next-stage shift register unit, the first electrode of the third transistor is coupled with the second electrode of the first output transistor, and the second electrode of the third transistor is coupled with the first power source.

14. The dynamic shift register circuit of claim 13, wherein the shift register unit further comprises:
   a fourth transistor having a first electrode, a second electrode, and a gate electrode; and
   a fifth transistor having a first electrode, a second electrode, and a gate electrode;
   wherein the first electrode of the fourth transistor is coupled with the output end, the second electrode of the fourth transistor is coupled with the first power source, the first electrode of the fifth transistor is coupled with the second electrode of the first output transistor, the second electrode of the fifth transistor is coupled with the first power source, and the gate electrode of the fifth transistor is coupled with the gate electrode of the fourth transistor.

15. The dynamic shift register circuit of claim 14, further comprising a second power source, wherein the shift register unit further comprises:
   a sixth transistor having a first electrode, a second electrode, and a gate electrode; and
   a seventh transistor having a first electrode, a second electrode, and a gate electrode;
   wherein the gate electrode and the first electrode of the sixth transistor are coupled with the second power source, the second electrode of the sixth transistor is coupled with the gate electrode of the switch transistor, the gate electrode of the seventh transistor is coupled with the output signal of the previous-stage shift register unit, the first electrode of the seventh transistor is coupled with the second electrode of the sixth transistor, the second electrode of the seventh transistor is coupled with the first power source, and the signal level of the second power source is greater than the signal level of the first power source.

16. The dynamic shift register circuit of claim 14, further comprising a second power source, wherein the shift register unit further comprises:
   an eighth transistor having a first electrode, a second electrode, and a gate electrode; and
   a ninth transistor having a first electrode, a second electrode, and a gate electrode;
   wherein the gate electrode and the first electrode of the eighth transistor are coupled with the second power source, the second electrode of the eighth transistor is coupled with the gate electrode of the fifth transistor, the gate electrode of the ninth transistor is coupled with the second electrode of the first output transistor, the first electrode of the ninth transistor is coupled with the gate electrode of the fifth transistor, and the second electrode of the ninth transistor is coupled with the first power source.

17. The dynamic shift register circuit of claim 14, wherein the shift register unit further comprises a tenth transistor having a first electrode, a second electrode, and a gate electrode, wherein the gate electrode of the tenth transistor is adapted to receive the output signal from the next-stage register unit, the first electrode of the tenth transistor is coupled with the second electrode of the input transistor, and the second electrode of the tenth transistor is coupled with the first power source.

* * * * *